US011361808B2

(12) United States Patent
Bell et al.

(10) Patent No.: US 11,361,808 B2
(45) Date of Patent: *Jun. 14, 2022

(54) APPARATUSES AND METHODS FOR SELECTIVE ROW REFRESHES

(71) Applicant: MICRON TECHNOLOGY, INC., Boise, ID (US)

(72) Inventors: Debra M. Bell, Dallas, TX (US); Jeff A. McClain, Nampa, ID (US); Brian P. Callaway, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/160,801

(22) Filed: Oct. 15, 2018

(65) Prior Publication Data

US 2019/0051344 A1    Feb. 14, 2019

Related U.S. Application Data

(63) Continuation of application No. 14/707,893, filed on May 8, 2015, now Pat. No. 10,134,461, which is a continuation of application No. 14/010,120, filed on Aug. 26, 2013, now Pat. No. 9,047,978.

(51) Int. Cl.
*G11C 11/406* (2006.01)
*G11C 7/10* (2006.01)

(52) U.S. Cl.
CPC .......... *G11C 11/406* (2013.01); *G11C 7/1012* (2013.01)

(58) Field of Classification Search
CPC .................. G11C 11/406; G11C 7/1012

USPC ......................................................... 365/222
See application file for complete search history.

(56) References Cited

U.S. PATENT DOCUMENTS

| 3,633,175 | A | 1/1972 | Harper |
| 5,291,198 | A | 3/1994 | Dingwall et al. |
| 5,299,159 | A | 3/1994 | Balistreri et al. |
| 5,422,850 | A | 6/1995 | Sukegawa et al. |
| 5,638,317 | A | 6/1997 | Tran |

(Continued)

FOREIGN PATENT DOCUMENTS

| CN | 1195173 A | 10/1998 |
| CN | 102113058 A | 1/2006 |

(Continued)

OTHER PUBLICATIONS

U.S. Appl. No. 16/231,327 titled "Apparatuses and Methods for Selective Row Refreshes", filed on Dec. 21, 2018.

(Continued)

*Primary Examiner* — Anthan Tran
(74) *Attorney, Agent, or Firm* — Dorsey & Whitney LLP (57) ABSTRACT

Apparatuses and methods for selective row refreshes are disclosed herein. An example apparatus may include a refresh control circuit. The refresh control circuit may be configured to receive a target address associated with a target plurality of memory cells from an address bus. The refresh control circuit may further be configured to provide a proximate address to the address bus responsive, at least in part, to determining that a number of refresh operations have occurred. In some examples, a plurality of memory cells associated with the proximate address may be a plurality of memory cells adjacent the target plurality of memory cells.

9 Claims, 4 Drawing Sheets

(56) References Cited

U.S. PATENT DOCUMENTS

| | | |
|---|---|---|
| 5,699,297 A | 12/1997 | Yamazaki et al. |
| 5,768,196 A | 6/1998 | Bloker et al. |
| 5,933,377 A | 8/1999 | Hidaka |
| 5,943,283 A | 8/1999 | Wong et al. |
| 5,970,507 A | 10/1999 | Kato et al. |
| 6,011,734 A | 1/2000 | Pappert |
| 6,061,290 A | 5/2000 | Shirley |
| 6,212,118 B1 | 4/2001 | Fujita |
| 6,310,806 B1 | 10/2001 | Higashi et al. |
| 6,317,381 B1 | 11/2001 | Gans et al. |
| 6,373,738 B1 | 4/2002 | Towler et al. |
| 6,424,582 B1 | 7/2002 | Ooishi |
| 6,434,064 B2 | 8/2002 | Nagai |
| 6,452,868 B1 | 9/2002 | Fister |
| 6,480,931 B1 | 11/2002 | Buti et al. |
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,187,607 B2 | 3/2007 | Koshikawa et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,283,380 B1 | 10/2007 | Srinivasan et al. |
| 7,319,602 B1 | 1/2008 | Srinivasan et al. |
| 7,444,577 B2 | 10/2008 | Best et al. |
| 7,551,502 B2 | 6/2009 | Dono et al. |
| 7,830,742 B2 | 11/2010 | Han |
| 8,451,677 B2 | 5/2013 | Okahiro et al. |
| 8,625,360 B2 | 1/2014 | Iwamoto et al. |
| 8,681,578 B2 | 3/2014 | Narui |
| 8,811,100 B2 | 8/2014 | Ku |
| 8,862,973 B2 | 10/2014 | Zimmerman et al. |
| 8,938,573 B2 * | 1/2015 | Greenfield .......... G06F 11/3037 711/101 |
| 9,032,141 B2 | 5/2015 | Bains et al. |
| 9,047,978 B2 | 6/2015 | Bell et al. |
| 9,058,900 B2 | 6/2015 | Kang |
| 9,087,554 B1 | 7/2015 | Park |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,139 B2 | 11/2015 | Jung et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,412,432 B2 | 8/2016 | Narui et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,741,409 B2 | 8/2017 | Jones et al. |
| 9,741,447 B2 | 8/2017 | Akamatsu |
| 9,747,971 B2 | 8/2017 | Bains et al. |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,818,469 B1 | 11/2017 | Kim et al. |
| 9,865,326 B2 | 1/2018 | Bains et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,387,276 B2 | 8/2019 | Ryu et al. |
| 10,446,216 B2 | 10/2019 | Oh et al. |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 | 6/2020 | Hirashima et al. |
| 10,770,127 B2 | 9/2020 | Shore et al. |
| 10,832,792 B1 | 11/2020 | Penney et al. |
| 10,861,519 B2 | 12/2020 | Jones et al. |
| 10,867,660 B2 | 12/2020 | Akamatsu |
| 10,943,636 B1 | 3/2021 | Wu et al. |
| 10,950,289 B2 | 3/2021 | Ito et al. |
| 10,964,378 B2 | 3/2021 | Ayyapureddi et al. |
| 11,043,254 B2 | 6/2021 | Enomoto et al. |
| 11,222,682 B1 | 1/2022 | Enomoto et al. |
| 2001/0008498 A1 | 7/2001 | Ooishi |
| 2002/0007476 A1 | 1/2002 | Kishino |
| 2002/0078311 A1 | 6/2002 | Matsuzaki et al. |
| 2002/0080677 A1 | 6/2002 | Watanabe |
| 2002/0181301 A1 * | 12/2002 | Takahashi ................. G11C 8/18 365/200 |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0123301 A1 | 7/2003 | Jang et al. |
| 2003/0193829 A1 | 10/2003 | Morgan et al. |
| 2004/0008544 A1 | 1/2004 | Shinozaki et al. |
| 2004/0022093 A1 | 2/2004 | Lee |
| 2004/0052142 A1 | 3/2004 | Ikehashi et al. |
| 2004/0114446 A1 | 6/2004 | Takahashi et al. |
| 2004/0130959 A1 | 7/2004 | Kawaguchi |
| 2004/0174757 A1 | 9/2004 | Garverick et al. |
| 2004/0184323 A1 | 9/2004 | Mori et al. |
| 2004/0218431 A1 | 11/2004 | Chung et al. |
| 2005/0105315 A1 | 5/2005 | Shin et al. |
| 2005/0243629 A1 | 11/2005 | Lee |
| 2006/0083099 A1 | 4/2006 | Bae et al. |
| 2006/0087903 A1 | 4/2006 | Riho et al. |
| 2006/0176744 A1 | 8/2006 | Stave |
| 2006/0262616 A1 | 11/2006 | Chen |
| 2007/0008799 A1 | 1/2007 | Dono et al. |
| 2007/0014174 A1 | 1/2007 | Ohsawa |
| 2007/0030746 A1 | 2/2007 | Best et al. |
| 2007/0133330 A1 | 6/2007 | Ohsawa |
| 2007/0230264 A1 | 10/2007 | Eto |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0062742 A1 | 3/2008 | Wang |
| 2008/0126893 A1 | 5/2008 | Harrand et al. |
| 2008/0130394 A1 | 6/2008 | Dono |
| 2008/0181048 A1 | 7/2008 | Han |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0301362 A1 | 12/2008 | Cavanna et al. |
| 2008/0316845 A1 | 12/2008 | Wang et al. |
| 2009/0077571 A1 | 3/2009 | Gara et al. |
| 2009/0161457 A1 | 6/2009 | Wakimoto |
| 2009/0185440 A1 | 7/2009 | Lee |
| 2009/0201752 A1 | 8/2009 | Riho et al. |
| 2009/0213675 A1 | 8/2009 | Shino |
| 2009/0296510 A1 | 12/2009 | Lee et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0329069 A1 | 12/2010 | Ito et al. |
| 2011/0026290 A1 | 2/2011 | Noda et al. |

(56) References Cited

U.S. PATENT DOCUMENTS

| | | |
|---|---|---|
| 2011/0051530 A1 | 3/2011 | Kushida |
| 2011/0069572 A1 | 3/2011 | Lee et al. |
| 2011/0216614 A1 | 9/2011 | Hosoe |
| 2011/0286271 A1 | 11/2011 | Chen |
| 2011/0310648 A1 | 12/2011 | Iwamoto et al. |
| 2011/0317462 A1 | 12/2011 | Gyllenhammer et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1* | 8/2012 | Riho .................... G11C 29/785 365/200 |
| 2013/0003467 A1 | 1/2013 | Klein |
| 2013/0003477 A1 | 1/2013 | Park et al. |
| 2013/0107623 A1 | 5/2013 | Kavalipurapu et al. |
| 2013/0279284 A1 | 10/2013 | Jeong |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0078845 A1 | 3/2014 | Song |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0136763 A1 | 5/2014 | Li et al. |
| 2014/0177370 A1 | 6/2014 | Halbert et al. |
| 2014/0189215 A1 | 7/2014 | Kang et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0317344 A1 | 10/2014 | Kim |
| 2014/0355332 A1 | 12/2014 | Youn et al. |
| 2014/0379978 A1 | 12/2014 | Kim et al. |
| 2015/0049567 A1 | 2/2015 | Chi |
| 2015/0055420 A1 | 2/2015 | Bell et al. |
| 2015/0089326 A1 | 3/2015 | Joe et al. |
| 2015/0155027 A1 | 6/2015 | Abe et al. |
| 2015/0170728 A1 | 6/2015 | Jung et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0294711 A1* | 10/2015 | Gaither ............. G11C 11/40611 711/106 |
| 2015/0340077 A1 | 11/2015 | Akamatsu |
| 2016/0019940 A1 | 1/2016 | Jang et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0099043 A1 | 4/2016 | Tu |
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0172056 A1 | 6/2016 | Huh |
| 2016/0180917 A1 | 6/2016 | Chishti et al. |
| 2016/0196863 A1 | 7/2016 | Shin et al. |
| 2016/0202926 A1 | 7/2016 | Benedict |
| 2016/0211008 A1 | 7/2016 | Benedict et al. |
| 2016/0225461 A1 | 8/2016 | Tuers et al. |
| 2017/0011792 A1 | 1/2017 | Oh et al. |
| 2017/0076779 A1 | 3/2017 | Bains et al. |
| 2017/0092350 A1 | 3/2017 | Halbert et al. |
| 2017/0117030 A1 | 4/2017 | Fisch et al. |
| 2017/0140811 A1 | 5/2017 | Joo |
| 2017/0213586 A1 | 7/2017 | Kang et al. |
| 2017/0263305 A1 | 9/2017 | Cho |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0005690 A1 | 1/2018 | Morgan et al. |
| 2018/0025770 A1 | 1/2018 | Ito et al. |
| 2018/0060194 A1 | 3/2018 | Ryu et al. |
| 2018/0090199 A1 | 3/2018 | Kim et al. |
| 2018/0158504 A1 | 6/2018 | Akamatsu |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0366182 A1 | 12/2018 | Hyun et al. |
| 2019/0013059 A1 | 1/2019 | Akamatsu |
| 2019/0066759 A1 | 2/2019 | Nale |
| 2019/0066762 A1 | 2/2019 | Koya |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |
| 2019/0198090 A1 | 6/2019 | Lee |
| 2019/0198099 A1 | 6/2019 | Mirichigni et al. |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1 | 8/2019 | Cha et al. |
| 2019/0267077 A1 | 8/2019 | Ito et al. |
| 2019/0333573 A1 | 10/2019 | Shin et al. |
| 2019/0348100 A1 | 11/2019 | Smith et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385667 A1 | 12/2019 | Morohashi et al. |
| 2020/0075106 A1 | 3/2020 | Tokutomi et al. |
| 2020/0090760 A1 | 3/2020 | Purahmad et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0202921 A1 | 6/2020 | Morohashi et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0349995 A1 | 11/2020 | Shore et al. |
| 2020/0365208 A1 | 11/2020 | Schreck et al. |
| 2020/0381040 A1 | 12/2020 | Penney et al. |
| 2020/0395072 A1 | 12/2020 | Penney et al. |
| 2021/0020262 A1 | 1/2021 | Penney et al. |
| 2021/0026732 A1 | 1/2021 | Park et al. |
| 2021/0065755 A1 | 3/2021 | Kim et al. |
| 2021/0065764 A1 | 3/2021 | Cheng et al. |
| 2021/0225432 A1 | 7/2021 | Enomoto et al. |

FOREIGN PATENT DOCUMENTS

| | | |
|---|---|---|
| CN | 101038785 | 9/2007 |
| CN | 101067972 | 11/2007 |
| CN | 101331554 A | 12/2008 |
| CN | 101458658 A | 6/2009 |
| CN | 101622607 A | 1/2010 |
| CN | 102483952 A | 5/2012 |
| JP | H0773682 A | 3/1995 |
| JP | 2005-216429 A | 8/2005 |
| JP | 2011-258259 | 12/2011 |

(56) References Cited

FOREIGN PATENT DOCUMENTS

| JP | 2013-004158 | A | | 1/2013 |
|---|---|---|---|---|
| KR | 1020180064940 | A | | 6/2018 |
| KR | 1020180085184 | A | | 7/2018 |
| WO | 2014120477 | | | 8/2014 |
| WO | 2015030991 | | | 3/2015 |
| WO | 2017171927 | A1 | | 10/2017 |
| WO | 2020191222 | A1 | | 9/2020 |

OTHER PUBLICATIONS

U.S. Appl. No. 16/190,627 titled "Apparatuses and Methods for Targeted Refreshing of Memory" filed Nov. 14, 2018.
International Search Report and Written Opinion for PCT/US2014/049357 dated Nov. 12, 2014.
U.S. Appl. No. 16/112,471 titled "Apparatuses and Methods for Controlling Refresh Operations" filed Aug. 24, 2018.
TW Office Action dated Nov. 26, 2015 for TW appl No. 103127973.
U.S. Appl. No. 16/546,152 titled "Apparatuses and Methods for Analog Row Access Tracking" filed Aug. 20, 2019, pp. all.
U.S. Appl. No. 16/548,027 titled "Apparatuses, Systems, and Methods for Analog Row Access Rate Determination" filed Aug. 22, 2019, pp. all.
U.S. Appl. No. 16/549,942 titled "Apparatuses and Methods for Lossy Row Access Counting" filed Aug. 23, 2019, pp. all.
U.S. Appl. No. 15/881,256 entitled 'Apparatuses and Methods for Detecting a Row Hammer Attack With a Bandpass Filter' filed on Jan. 26, 2018, pp. all.
U.S. Appl. No. 16/425,525 titled "Apparatuses and Methods for Tracking ll Row Accesses" filed May 29, 2019, pp. all.
U.S. Appl. No. 16/427,105 titled "Apparatuses and Methods for Priority Targeted Refresh Operations" filed May 30, 2019, pp. all.
U.S. Appl. 16/427,140 titled "Apparatuses and Methods for Tracking Row Access Counts Between Multiple Register Stacks" filed May 30, 2019, pp. all.
U.S. Appl. No. 16/437,811 titled "Apparatuses, Systems, and Methods for Determining Extremum Numerical Values" filed Jun. 11, 2019, pp. all.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory" filed on Oct. 27, 2017; pp. all.
U.S. Appl. No. 16/012,679, titled "Apparatuses and Methods for Multiple Row Hammer Refresh Address Sequences", filed Jun. 19, 2018, pp. all.
U.S. Appl. No. 16/020,863, titled "Semiconductor Device", filed Jun. 27, 2018, pp. all.
U.S. Appl. No. 16/176,932, titled "Apparatuses and Methods for Access Based Refresh Timing", filed Oct. 31, 2018, pp. all.
U.S. Appl. No. 16/237,291, titled "Apparatus and Methods for Refreshing Memory", filed Dec. 31, 2018, pp. all.
U.S. Appl. No. 16/268,818, titled "Apparatuses and Methods for Managing Row Access Counts", filed Feb. 6, 2019, pp. all.
U.S. Appl. No. 16/358,587, titled "Semiconductor Device Having Cam That Stores Address Signals", dated Mar. 19, 2019, pp. all.
U.S. Appl. No. 16/411,573 titled "Apparatuses, Systems, and Methods for a Content Addressable Memory Cell" filed May 14, 2019, pp. all.
U.S. Appl. No. 16/411,698 title "Semiconductor Device" filed May 14, 2019, pp. all.
U.S. Appl. No. 16/427,330 titled "Apparatuses and Methods for Storing Victim Row Data" filed May 30, 2019, pp. all.
U.S. Appl. No. 16/428,625 titled "Apparatuses and Methods for Tracking Victim Rows" filed May 31, 2019, pp. all.
U.S. Appl. No. 15/876,566 entitled 'Apparatuses and Methods for Calculating Row Hammer Refresh Addresses in a Semiconductor Device' filed on Jan. 22, 2018, pp. all.
PCT Application No. PCT/US18/55821 "Apparatus and Methods for Refreshing Memory" filed Oct. 15, 2018., pp. all.
U.S. Appl. No. 15/715,846, entitled "Semiconductor Device", filed Sep. 26, 2017, pp. all.
U.S. Appl. No. 16/459,520 titled "Apparatuses and Methods for Monitoring Word Line Accesses", filed Jul. 1, 2019, pp. all.
U.S. Appl. No. 15/281,818, entitled: "Semiconductor Device" filed on Sep. 30, 2016; pp. all.
Kim. et al., "Flipping Bits in MemoryWithout Accessing Them: An Experimental Study of DRAM Disturbance Errors", IEEE, Jun. 2014, 12 pgs.
U.S. Appl. No. 16/797,658, titles "Apparatuses and Methods for Controlling Refresh Operations", filed Feb. 21, 2020.
U.S. Appl. No. 16/513,400 titled "Apparatuses and Methods for Tracking Row Accesses" filed Jul. 16, 2019.
U.S. Appl. No. 16/805,197, titled "Apparatuses and Methods for Calculating Row Hammer Refresh Addresses in a Semiconductor Device", dated Feb. 28, 2020.
U.S. Appl. No. 16/936,297 titled "Apparatuses and Methods for Managing Row Access Counts" filed Jul. 22, 2020.
Thomas, et al., "Voltage Source Based Voltage-to-Time Converter", IEEE, 2020, p. All.
U.S. Appl. No. 17/102,266, titled "Apparatuses and Methods for Tracking Word Line Accesses" dated Nov. 23, 2020.
U.S. Appl. No. 17/153,555 titled "Apparatuses and Methods for Dynamically Allocated Aggressor Detection" filed Jan. 20, 2021.
U.S. Appl. No. 17/201,941 titled "Apparatuses and Methods for Sketch Circuits for Refresh Binning" filed Mar. 15, 2021.
U.S. Appl. No. 17/301,533 titled "Semiconductor Device Having CAM That Stores Address Signals" filed Apr. 6, 2021.
U.S. Appl. No. 17/007,069 titled "Apparatuses and Methods for Providing Refresh Addresses" filed Aug. 31, 2020.
U.S. Appl. No. 17/375,817 titled "Apparatuses and Methods for Monitoring Word Line Accesses" filed Jul. 14, 2021.
U.S. Appl. No. 17/443,056 titled "Apparatuses and Methods for Multiple Row Hammer Refresh Address Sequences" filed Jul. 20, 2021.

\* cited by examiner

APPARATUSES AND METHODS FOR SELECTIVE ROW REFRESHES

CROSS-REFERENCE TO RELATED APPLICATION

This application is a continuation of U.S. patent application Ser. No. 14/707,893, filed May 8, 2015 and issued as U.S. Pat. No. 10,134,461 on Nov. 20, 2018, which is a continuation of U.S. patent application Ser. No. 14/010,120, filed Aug. 26, 2013, and issued as U.S. Pat. No. 9,047,978 on Jun. 2, 2015. The afore-mentioned applications and patents are incorporated by reference herein, in their entirety, and for all purposes.

TECHNICAL FIELD

Embodiments of the present invention relate generally to semiconductor memory, and more specifically, in one or more described embodiments, to refreshing a row or rows of memory physically adjacent a target row of memory.

BACKGROUND

In current memory systems, data stored in volatile memories (e.g., DRAM) must be periodically refreshed to compensate for inherent leakage of capacitors in memory cells. In essence, refreshing includes, for example, reading data out of each row of memory and subsequently writing the data back to the same respective row. As a result, the original charge level on each capacitor is restored and data preserved.

While many approaches for using memory refreshes to compensate for leakage are well known in the art, these approaches have struggled when applied to the increasingly demanding operating speeds and applications of memories today. For example, in some instances, a particular row or rows of memory may be repeatedly accessed at a high frequency. Data stored by memory cells of rows physically adjacent the repeatedly accessed row of memory may be degraded before normal refresh operations are performed to preserve the data of those adjacent rows. That is, due to coupling effects, cell to cell leakage may increase, and the repetitive accesses may degrade data of rows physically adjacent the repetitively accessed row or rows.

DETAILED DESCRIPTION

Apparatuses and methods for selective row refreshes are disclosed herein. In accordance with one or more embodiments of the described invention, one or more rows physically adjacent a target row may be refreshed. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Examples of the present invention relate generally to memory operations. Typically, memories, such as DRAM, operate in accordance with at least three types of operations, read operations, write operations, and refresh operations. For each operation, an active command is provided to activate (e.g., open) a particular row, a respective operation is performed on the row, and a precharge command is provided to deactivate (e.g., close) the row.

Read and write operations may be performed using an externally generated address (e.g., external address), which may be decoded into a target address. For example, the external address and an active command may be provided to a memory, and in response a target row associated with the target address may be activated. When a subsequent read or write command is provided to the memory, the memory may read data from or write data to the target row accordingly. The target row may remain activated until a precharge command is received, whereupon the target row may be deactivated.

Refresh operations may be performed using an internally generated address (e.g., refresh address). For example, a refresh command may be provided to a memory and cause a row associated with a refresh address to be refreshed. When a subsequent refresh command is provided to the memory, a row associated with a new refresh address is refreshed. In many instances, a refresh address may be provided (e.g., generated) using a counter, and the counter may increment after each refresh operation such that rows may be refreshed sequentially. Moreover, rows of memory may be refreshed in several ways. Refresh operations may, for instance, be interleaved with other operations (e.g., read operations, write operations), allowing a memory to refresh rows as necessary, while prioritizing other operations. Typically, refresh operations are performed in bursts. For example, a plurality of refresh operations may be performed in succession between operations. Accordingly, in between various read and write operations, a memory may receive a plurality of successive refresh commands, with each refresh command causing a respective row to be refreshed.

Figure 1:
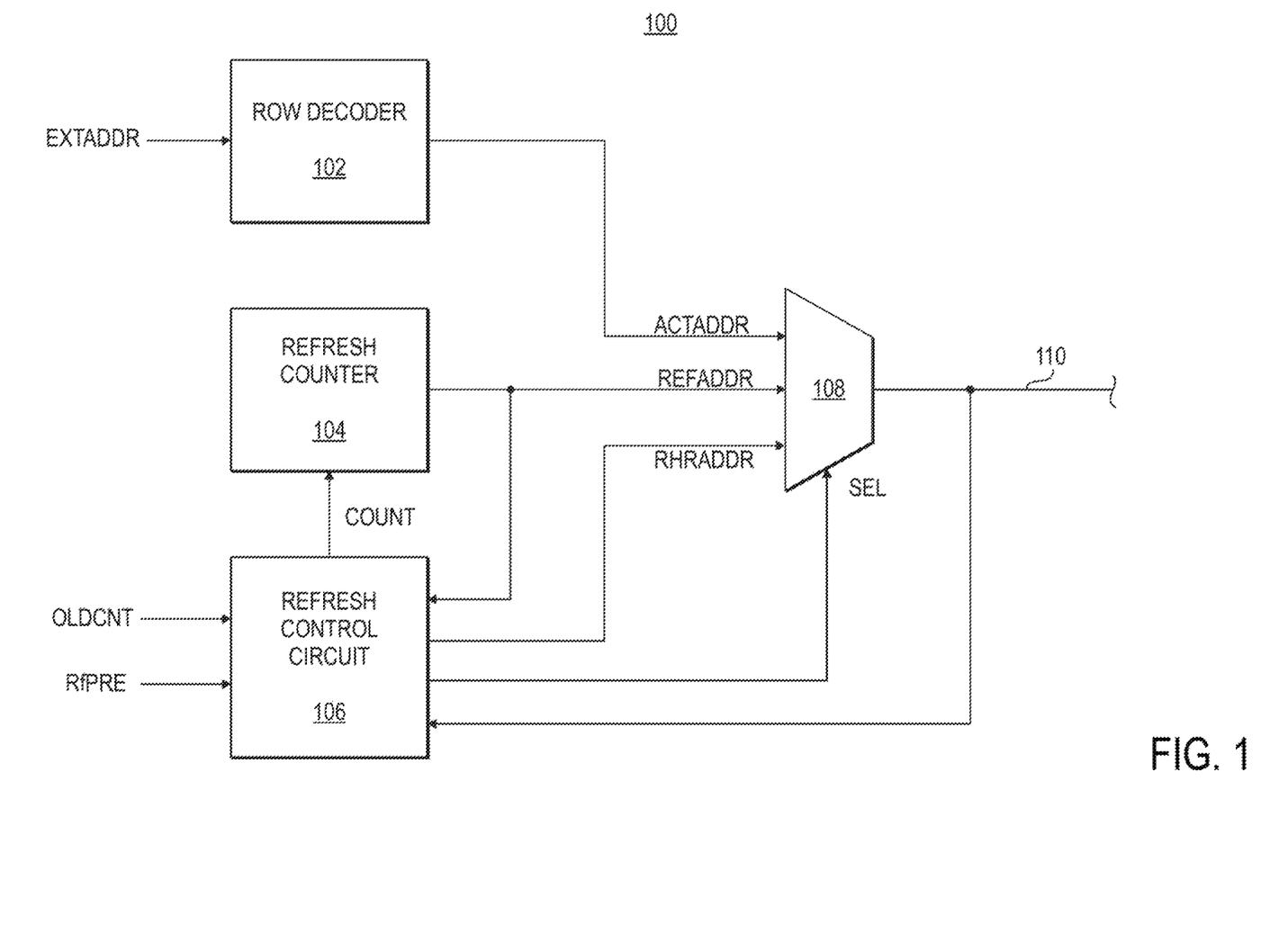
FIG. 1 is a block diagram of an apparatus according to an embodiment of the present invention.

FIG. 1 is a block diagram of an apparatus 100 according to an embodiment of the invention. The apparatus 100 may include a row decoder 102, a refresh counter 104, a refresh control circuit 106, a multiplexer 108, and an address bus 110.

The row decoder 102 may be coupled to the multiplexer 108 and configured to provide a target address ACTADDR to an input of the multiplexer 108, for instance, in response to decoding an external address EXTADDR. The external address EXTADDR may comprise an externally generated address and may be provided from an external device such as controller (e.g., memory controller). The row associated with the target address ACTADDR may comprise a target row.

The refresh counter 104 may be coupled to the multiplexer 108 and configured to provide a refresh address REFADDR to an input of the multiplexer 108. In at least one embodiment, the refresh address REFADDR may be used to refresh a row associated with the refresh row address REFADDR in association with (e.g., before, prior to, during, after, in response to) a refresh operation. The refresh counter 104 may comprise a counter, such as a binary counter, and the refresh address REFADDR may comprise a count of the refresh counter 104. The refresh counter 104 may be configured to increment based, at least in part, on the control signal COUNT. In some examples, the refresh counter 104 may be configured to increment responsive, at least in part, to an edge (e.g., rising edge) of the control signal COUNT.

The refresh control circuit 106 may be coupled to the address bus 110 and configured to provide a proximate address RHRADDR to an input of the multiplexer 108. The proximate address RHRADDR may be based, at least in part, on an address, such as a target address ACTADDR provided by the multiplexer 108 via the address bus 110. In some examples, the refresh control circuit 106 may be configured to latch (e.g., store) the target address ACTADDR, for instance, in response to an active command associated with a read or write operation.

The refresh control circuit 106 may further be configured to provide the control signal SEL to the multiplexer 108. Based, at least in part, on the control signal SEL, the multiplexer 108 may selectively provide the target address ACTADDR received from the row decoder 102, the refresh address REFADDR received from the refresh counter 104, or the proximate address RHRADDR received from the refresh control circuit 106, to the address bus 110. By way of example, the refresh control circuit 106 may be configured to cause the multiplexer 108 to selectively provide the target address ACTADDR in association with read and write operations and to selectively provide the refresh address REFADDR in association with refresh operations. Accordingly, for a read operation or a write operation, data may be read from or written to a target row associated with the target address ACTADDR. For a refresh operation, a row associated with the refresh address REFADDR may be refreshed.

As will be described in more detail below, the refresh control circuit 106 may further be configured to cause the multiplexer 108 to selectively provide proximate addresses RHRADDR to the address bus 110 in association with respective interrupt operations. In some examples, providing proximate addresses RHRADDR in this manner may cause rows associated with the proximate addresses RHRADDR to be refreshed. In at least one embodiment, a proximate address RHRADDR may comprise an address associated with a row physically adjacent a target row, e.g., a row associated with a target address ACTADDR. In some examples, the refresh control circuit 106 may perform one or more interrupt operations after a particular number of refresh operations have been performed.

The refresh control circuit 106 may further be configured to receive a control signal OLDCNT. The control signal OLDCNT may be asserted, for instance by control logic (not shown in FIG. 1), each time a row is refreshed. For example, the control signal OLDCNT may be asserted when a refresh command is provided. Based, at least in part, on the control signal OLDCNT, the refresh control circuit 106 may selectively assert the control signal COUNT. As described, asserting the control signal COUNT may cause the refresh address REFADDR to be incremented. The refresh control circuit 106 may further be configured to receive a control signal RfPRE. The control signal RfPRE may be asserted, for instance by control logic (not shown in FIG. 1), each time a row is refreshed. For example, the control signal RfPRE may be asserted each time a row is precharged in association with a refresh operation.

In an example read operation or write operation of the apparatus 100, an active command and an external address EXTADDR may be provided. The row decoder 102 may decode the external address EXTADDR to provide a target address ACTADDR to the multiplexer 108, and the multiplexer 108 may selectively provide the target address ACTADDR to the address bus 110 based, at least in part, on the control signal SEL. A read or write operation may be performed, and data may be read from or written to the target row associated with the target address ACTADDR, respectively. The target row may subsequently be deactivated. The refresh control circuit 106 may receive and latch the target address ACTADDR for instance, responsive to the active command associated with the read operation or write operation.

Responsive, at least in part, to latching the output address ACTADDR, the refresh control circuit 106 may provide (e.g., generate) proximate addresses RHRADDR. As described, a proximate address RHRADDR may comprise an address associated with a row physically adjacent a target row. Thus providing proximate addresses RHRADDR may include providing addresses of rows physically adjacent the target row. By way of example, the refresh control circuit 106 may increment the target address ACTADDR to provide a first proximate address RHRADDR, and may decrement the target address ACTADDR to provide a second proximate address RHRADDR. In another example, the refresh control circuit 106 may increment or decrement the target address ACTADDR to provide a first proximate address RHRADDR. An exclusive OR (XOR) operation may be performed on the first proximate address RHRADDR and the target address ACTADDR to provide a second proximate address RHRADDR. The proximate row addresses RHRADDR may be provided after the target address ACTADDR has been latched, such as prior to and/or in association with an interrupt operation.

In an example refresh operation, a refresh command may be provided and the refresh control circuit 106 may cause the multiplexer 108 to selectively provide the refresh address REFADDR to the address bus 110. The row associated with the refresh address REFADDR may be refreshed, and the refresh address REFADDR may be incremented. As described, refresh operations may be performed in succession between other operations, such as read and write operations. Accordingly, subsequent refresh operations may be performed in response to respective refresh commands such that rows are refreshed sequentially.

After a particular number of rows have been refreshed, that is, after a particular number of refresh operations have been performed, the refresh control circuit 106 may perform an interrupt operation to refresh memory associated with a proximate address RHRADDR. Briefly, in association with an interrupt operation, a row associated with the proximate address RHRADDR may be refreshed. The refresh control circuit 106 may determine the number of rows refreshed based, at least in part, on the refresh address REFADDR, for instance, by determining that a particular bit of the refresh address REFADDR has transitioned from a first state to a second state (e.g., logic low to logic high). For example, a transition of a ninth least significant bit of a refresh address REFADDR that was incremented by one starting from zero may indicate that 256 rows have been refreshed.

Performing an interrupt operation may include the multiplexer 108 selectively providing a proximate address RHRADDR to the address bus 110. This may in turn cause the row associated with the proximate address RHRADDR to be refreshed. In one embodiment, interrupt operations may be performed consecutively until rows associated with a plurality of proximate addresses RHRADDR have been refreshed. In other embodiments, interrupt operations are not performed consecutively.

In at least one embodiment, the refresh control circuit 106 may be configured to perform an interrupt operation responsive, at least in part, to a refresh command. For example, once the refresh control circuit 106 has determined that a particular number of rows have been refreshed, the refresh control circuit 106 may perform an interrupt operation in response to a subsequent refresh command, or in response to each of a plurality of subsequent refresh commands for a plurality of proximate addresses RHRADDR. In response to each refresh command, the refresh control circuit 106 may provide a proximate address RHRADDR such that the row associated with the respective proximate address RHRADDR is refreshed.

In association with interrupt operations, the refresh control circuit 106 may not assert the control signal COUNT. In this manner, the refresh control circuit 106 may hold the refresh address REFADDR at a same value while a row associated with the proximate address RHRADDR is refreshed in association with the interrupt operation. Thus, after interrupt operations have completed, the refresh control circuit 106 may assert the control signal COUNT responsive to a subsequent refresh command so that the refresh counter 104 may resume providing addresses without "skipping" a refresh of a row as a result of an interrupt operation during which a row associated with a proximate address RHRADDR is refreshed.

As described, the refresh control circuit 106 may be configured to latch a target address ACTADDR. In at least one embodiment, the refresh control circuit 106 may be configured to latch the most recent target address ACTADDR such that the most recent address provided by the row decoder 102 is used to provide a proximate address RHRADDR, and therefore the row or rows refreshed in association with interrupt operations. In other embodiments, the refresh control circuit 106 may be configured to latch multiple target addresses ACTADDR. For example, the refresh control circuit 106 may be configured to latch (e.g., store) the previous four target addresses ACTADDR provided by the row decoder 102. Accordingly, interrupt operations may include refreshing rows physically adjacent one or more of the latched target addresses ACTADDR.

In some embodiments, the refresh control circuit 106 may further be configured to selectively perform refresh operations. For example, the refresh control circuit 106 may be configured to perform an interrupt operation to refresh a row if the row is functional. In this manner, accessing malfunctioning and/or damaged rows may be avoided. Moreover, if the target row is a boundary row (e.g., a row of primary memory physically adjacent a redundant portion or a row of redundant memory physically adjacent a primary portion), the refresh control circuit 106 may be configured to selectively perform an interrupt operation to refresh an adjacent row in a neighboring portion if the adjacent row is functional.

As described, if a target row is repeatedly accessed (e.g., in association with a read operation or a write operation), coupling effects may result in increased cell to cell leakage, and degradation of data stored in rows physically adjacent a repetitively accessed row. Accordingly, by refreshing rows associated with proximate addresses RHRADDR in association with refresh operations, the physically adjacent rows may be refreshed more frequently, thereby reducing degradation of the data stored by the adjacent rows. By latching the most recent target address, and subsequently refreshing the rows physically adjacent the target row associated with the target address, the physically adjacent rows may be refreshed without a need to determine a number of times a row is accessed within a particular period of time.

Figure 2:
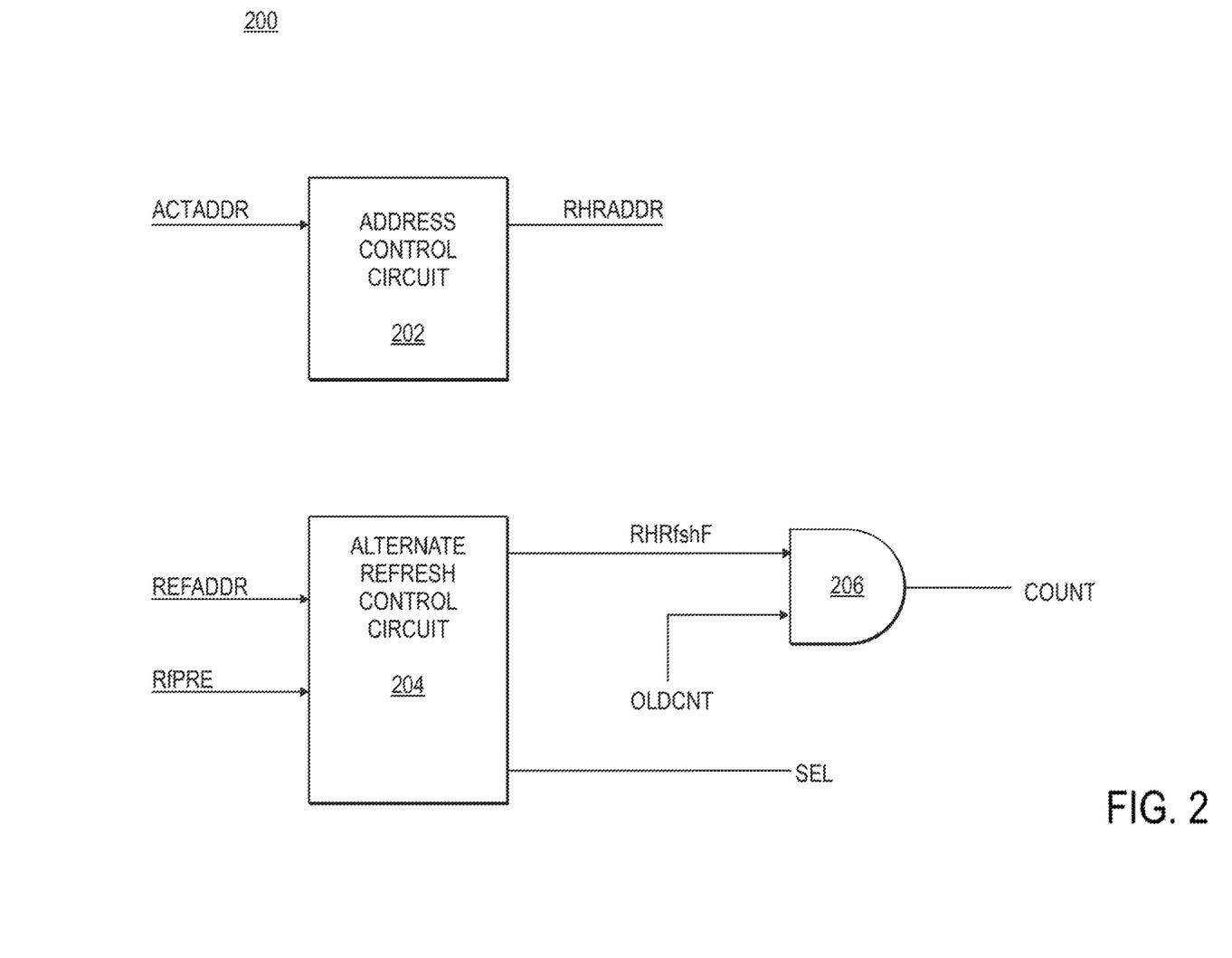
FIG. 2 is a schematic block diagram of a refresh control circuit according to an embodiment of the present invention.

FIG. 2 is a schematic block diagram of a refresh control circuit 200 according to an embodiment of the present invention. The refresh control circuit 200 may be used to implement the refresh control circuit 106 of FIG. 1. The refresh control circuit 200 may include an address control circuit 202, an alternate refresh control circuit 204, and an AND logic gate 206.

The address control circuit 202 may be configured to receive the target address ACTADDR and provide the proximate address RHRADDR. As described, the address control circuit 202 may provide one or more proximate addresses RHRADDR based, at least in part, on the target address ACTADDR. A proximate row addresses RHRADDR may be associated with a row physically adjacent a target row.

The alternate refresh control circuit 204 may be configured to receive the refresh row address REFADDR, for instance, from the refresh counter 104 of FIG. 1, and further may receive the control signal RfPRE. Based, at least in part, on the refresh row address REFADDR and the control signal RfPRE, the alternate refresh control circuit 204 may provide a control signal RHRfshF. The alternate refresh control circuit 204 may, for instance, assert the control signal RHRfshF in association with read and write operations and refresh operations.

The AND logic gate 206 may receive the control signal RHRfshF and the control signal OLDCNT. The control signal OLDCNT may be asserted in response to a row being refreshed, for instance in association with a refresh operation and/or an interrupt operation. Because the control signal RHRfshF may not be asserted during interrupt operations, however, the AND logic gate may assert the COUNT signal responsive to a row being refreshed in association with a refresh operation. In this manner, the refresh address REFADDR may be incremented responsive to refreshes associated with refresh operations, in contrast to refreshes associated with interrupt operations.

The alternate refresh control circuit 204 may further be configured to provide the control signal SEL and cause the multiplexer 108 of FIG. 1 to selectively provide the target address ACTADDR, the refresh address REFADDR, or the proximate address RHRADDR to the address bus 110 in association with read and write operations, refresh operations, and interrupt operations, respectively.

Figure 3:
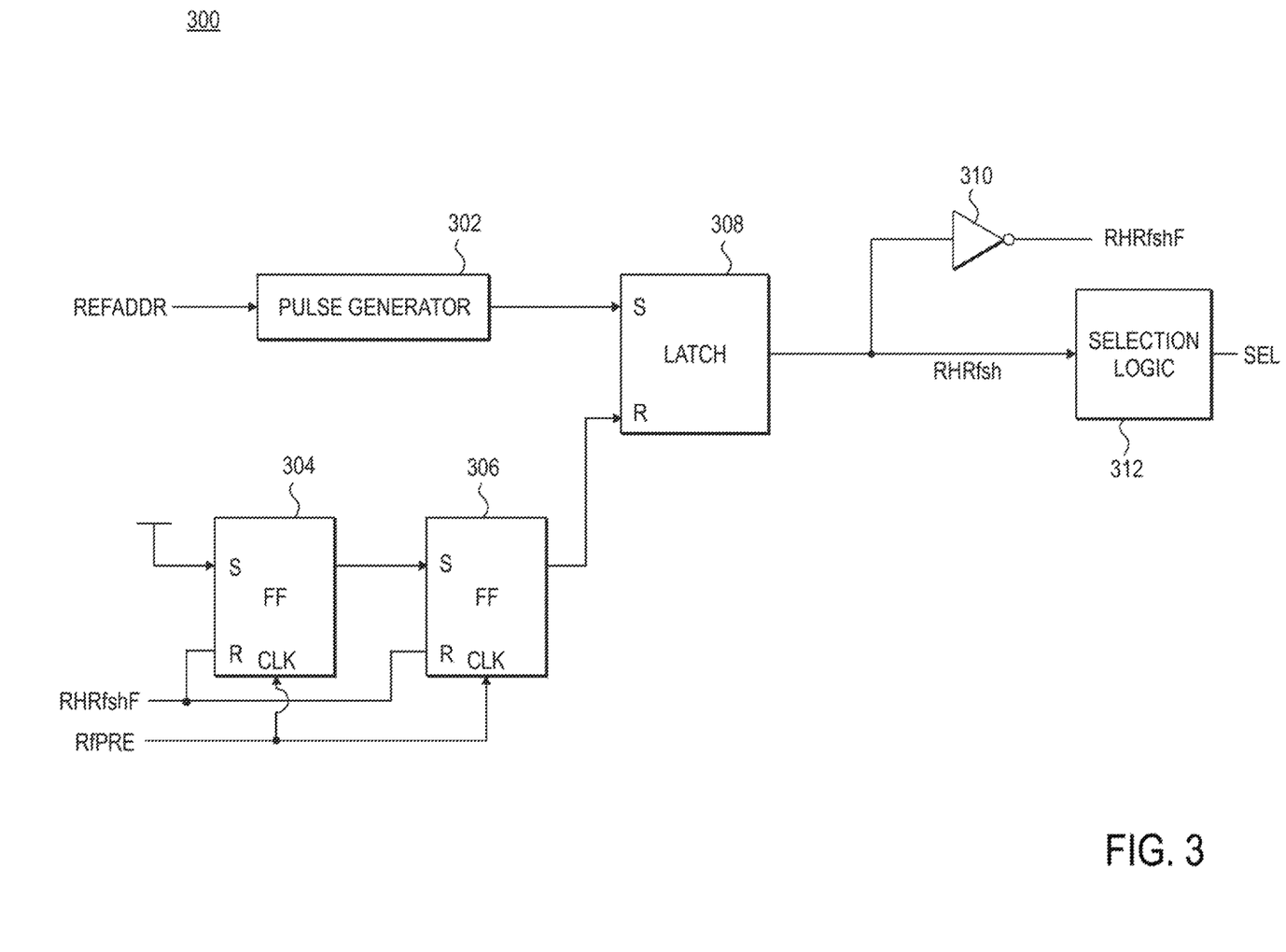
FIG. 3 is a schematic block diagram of an alternate refresh control circuit according to an embodiment of the present invention.

FIG. 3 is a schematic block diagram of an alternate refresh control circuit 300 according to an embodiment of the present invention. The alternate refresh control circuit 300 may be used to implement the alternate refresh control circuit 204 of FIG. 2. The alternate refresh control circuit 300 may include a pulse generator 302, flip-flops 304, 306, a set-reset (SR) latch 308, an inverter 310, and selection logic 312.

The pulse generator 302 may be configured to receive the refresh address REFADDR, for instance, from the refresh counter 104 of FIG. 1. Based, at least in part, on the refresh address REFADDR, the pulse generator 302 may provide a pulse to the SR latch 308. In some examples, the pulse generator 302 may be configured to provide a pulse responsive to determining that a particular number of refresh operations have been performed. This may, for instance, include determining that a particular bit of the refresh address REFADDR has transitioned from a first state to a second state. The flip-flops 304, 306 may be configured to receive the control signals RHRfshF and RfPRE at reset R and clock CLK inputs, respectively. The flip-flop 304 may be configured to receive a logic high supply voltage at its data S input.

The SR latch 308 may be configured to receive pulses from the pulse generator at a first S input and to receive the output of the flip-flop 306 at a second R input. The SR latch 308 may be configured to provide a control signal RHRfsh. The control signal RHRfsh may be received by the inverter 310 and inverted to provide the control signal RHRfshF.

The selection logic 312 may be configured to receive the control signal RHRfsh and provide the control signal SEL. As previously described, the control signal SEL may be provided to the multiplexer 108 of FIG. 1 to cause the multiplexer 108 to selectively provide the target address ACTADDR, the refresh address REFADDR, or the proximate address RHRADDR to an address bus, such as the address bus 110 of FIG. 1. The selection logic 312 may be configured to cause the multiplexer 108 to provide proximate addresses RHRADDR responsive the control signal RHRfsh being asserted.

In an example operation, the pulse generator 302 may determine that a particular number of refresh operations have been performed, for example, that a particular bit of the refresh address REFADDR has transitioned between states. As a result, the pulse generator 302 may provide a pulse to the SR latch 308.

In response, the SR latch 308 may provide an asserted control signal RHRfsh and the selection logic 312 may in turn cause the multiplexer 108 to provide a first proximate address RHRADDR to the address bus 110 in association with a first interrupt operation. As a result, a row associated with the proximate row address RHRADDR may be refreshed. Concurrently, the inverter 310 may invert the asserted control signal RHRfsh to provide the control signal RHRfshF. The control signal RHRfshF may not be asserted and thereby not cause the flip-flops 304, 306 to reset.

After the row associated with the first proximate row address RHRADDR is refreshed, the control signal RfPRE may be asserted and cause the flip-flops 304, 306 to clock such that the output of the flip-flop 304 transitions to a logic high level. A second proximate row address RHRADDR may be provided in association with a second interrupt operation and a row associated with the second proximate row address RHRADDR may be refreshed. After the row is refreshed, the control signal RfPRE may once again be asserted and cause the flip-flops 304, 306 to clock such that the output of the flip-flop 306 transitions to a logic high level. This may in turn cause the SR latch 308 to reset and cease asserting the control signal RHRfsh. The flip-flops 304, 306 may return to the reset state responsive to the control signal RHRfshF, and the selection logic 312 may cause the multiplexer 108 to selectively provide the refresh row address REFADDR to the address bus 110 such that refresh operations may resume. The first and second proximate row addresses RHRADDR may be associated with two rows adjacent a latched target row address. Refreshing the two adjacent rows in association with the first and second interrupt operations may prevent data stored by memory cells of the two adjacent rows from being degraded by repeated accesses of the row associated with the latched target row address.

In some examples, refreshing a row may include refreshing a plurality of memory cells. Moreover, a plurality of memory cells may comprise either a row of memory cells and/or a column of memory cells. Accordingly, although examples described herein are directed to selective row refreshes, it will be appreciated that described examples may be applied to memory cells such that selective column refreshes may be performed as well. In this manner, embodiments described herein may be applied to refresh a plurality of memory cells configured in any arrangement, such as in a row, column, fat row (e.g., multiple rows), fat column (multiple columns), or combination thereof.

Figure 4:
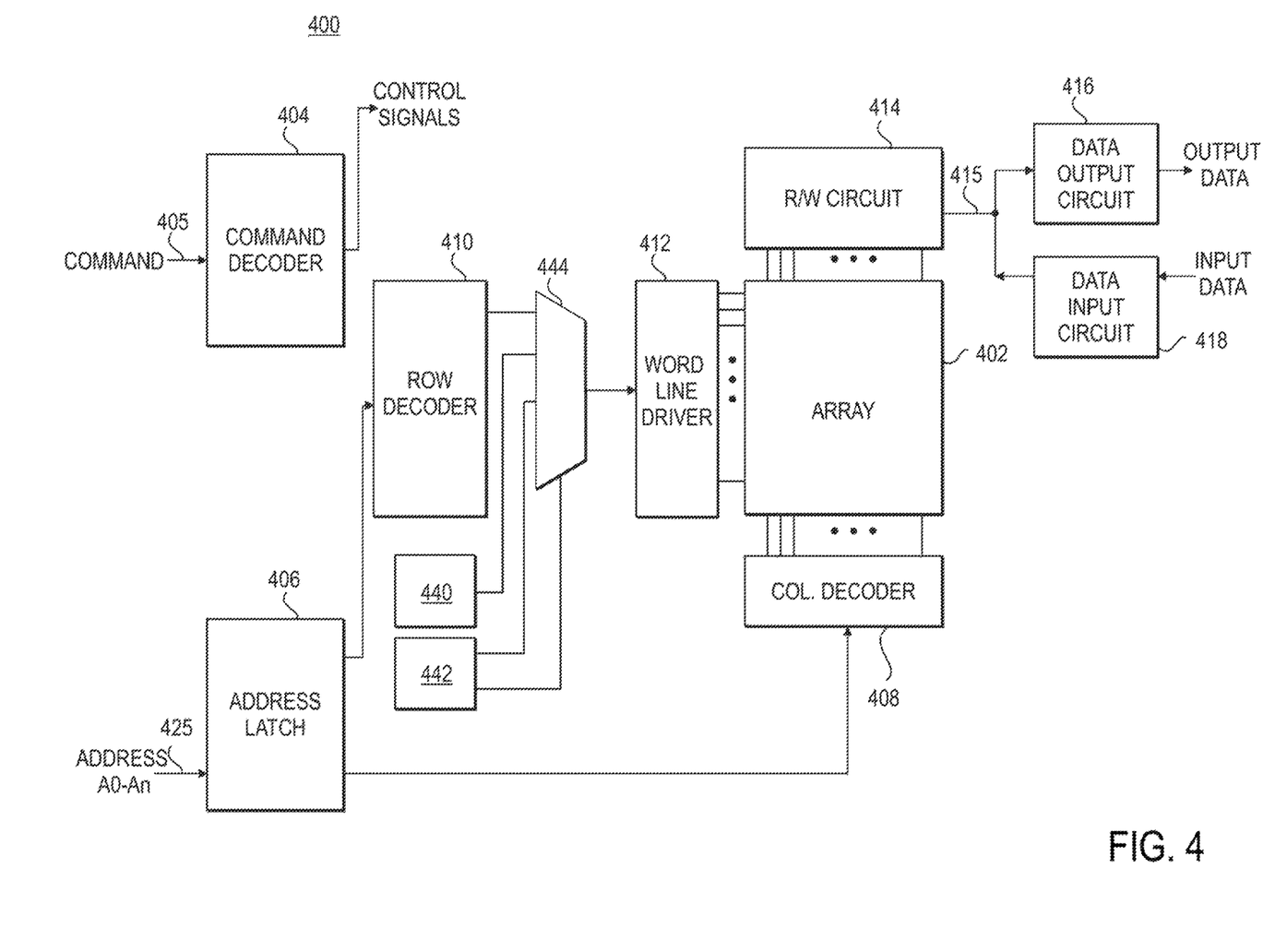
FIG. 4 is a block diagram of a memory including an apparatus according to an embodiment of the invention.

FIG. 4 is a block diagram of a memory 400 including an apparatus according to an embodiment of the invention. The memory 400 includes an array 402 of memory cells, which may be, for example, volatile memory cells, non-volatile memory cells, DRAM memory cells, SRAM memory cells, flash memory cells, or other types of memory cells. The memory 400 includes a command decoder 406 that receives memory commands and addresses through an ADDR/CMD bus. The command decoder 404 provides control signals, based on the commands received through the command bus 405. The command decoder 404 also provides row and column addresses to the memory 400 through an address bus 425 and an address latch 406. The address latch then outputs separate column addresses and separate row addresses.

The row and column addresses are provided by the address latch 406 to a row decoder 410 and a column decoder 408, respectively. The row decoder may comprise a row decoder described herein, such as the row decoder 102 of FIG. 1. The column decoder 408 selects bit lines extending through the array 402 corresponding to respective column addresses. The row decoder 410 is coupled to a multiplexer 444, which may comprise any multiplexer described herein, such as the multiplexer 108 of FIG. 1. A refresh counter 440 and a refresh control circuit 442 according to an embodiment of the invention may further be coupled to the multiplexer 444. For example, the refresh counter 440 and the refresh control circuit 442 may comprise a refresh counter and refresh control circuit described herein. The multiplexer 444 may be coupled to word line driver 424 that activates respective rows of memory cells in the array 402 corresponding to received row addresses. The selected data line (e.g., a bit line or bit lines) corresponding to a received column address is coupled to a read/write circuitry 414 to provide read data to a data output circuit 416 via an input-output data bus 415. Write data are provided to the array 402 through a data input circuit 418 and the memory array read/write circuitry 414. The command decoder 404 responds to memory commands and addresses provided to the command bus to perform various operations on the array 402. In particular, the command decoder 404 is used to provide control signals to read data from and write data to the array 402.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus comprising:
a memory device configured to:
provide, via a refresh counter included in the memory device, a first address indicating a first plurality of memory cells;
perform a first refresh operation on the first plurality of memory cells, responsive, at least in part, to an issuance of a first refresh command;
respond to an issuance of an active command to perform an active operation on a second plurality of memory cells indicated by a second address;

provide, via a refresh control circuit included in the memory device, a third address based on the second address, the third address indicating a third plurality of memory cells; and perform a second refresh operation on the third plurality of memory cells, responsive, at least in part, to an issuance of a second refresh command while suspending performing the first refresh operation on the first plurality of memory cells.

2. The apparatus as claimed in claim 1, wherein the refresh control circuit is configured to provide a fourth address indicating a fourth plurality of memory cells, wherein each of the second plurality of memory cells is between a corresponding one of the third plurality of memory cells and a corresponding one of the fourth plurality of memory cells, and wherein the memory device is further configured to perform consecutively the second refresh operation on the third plurality of memory cells and a third refresh operation on the fourth plurality of memory cells.

3. The apparatus as claimed in claim 1, wherein the memory device is further configured to resume, after the second refresh operation is performed on the third plurality of memory cells, performing the first refresh operation on the corresponding first plurality of memory cells based on addresses that were provided before the second refresh operation on the third plurality of memory cells was performed.

4. The apparatus as claimed in claim 1, wherein the refresh command is externally applied to the memory device.

5. The apparatus as claimed in claim 4, wherein the refresh control circuit is configured to provide a fourth address indicating a fourth plurality of memory cells, responsive, at least in part, to a different issuance of the active command, and wherein the memory device is configured to perform the second refresh operation on the third plurality of memory cells and a third refresh operation on the fourth plurality of memory cells with an intervention of a first period of time.

6. The apparatus as claimed in claim 5, wherein the first period of time is defined by a number of the refresh operations.

7. The apparatus as claimed in claim 1, wherein the memory device is configured to resume, after the second refresh operation is performed on the third plurality of memory cells, performing the first refresh operation on the corresponding first plurality of memory cells.

8. The apparatus of claim 1, wherein suspending performing the first refresh operation includes holding the first address at a same value during the second refresh operation.

9. The apparatus of claim 8, further comprising a counter configured to increment the first address based, at least in part, on a control signal from the refresh control circuit, wherein the refresh control circuit is configured to assert the control signal each time the first operation is performed, and further configured not to assert the control signal during the second refresh operation.

* * * * *